(12) United States Patent
Chen et al.

(10) Patent No.: US 11,735,564 B2
(45) Date of Patent: Aug. 22, 2023

(54) THREE-DIMENSIONAL CHIP PACKAGING STRUCTURE AND METHOD THEREOF

(71) Applicant: SJ SEMICONDUCTOR (JIANGYIN) CORPORATION, JiangYin (CN)

(72) Inventors: Yenheng Chen, Jiangyin (CN); Chengchung Lin, Jiangyin (CN); Chengtar Wu, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 13 days.

(21) Appl. No.: 17/112,835

(22) Filed: Dec. 4, 2020

(65) Prior Publication Data

US 2021/0175210 A1 Jun. 10, 2021

(30) Foreign Application Priority Data

Dec. 4, 2019 (CN) .......................... 201911229312.9
Dec. 4, 2019 (CN) .......................... 201922147430.7

(51) Int. Cl.
| | |
|---|---|
| *H01L 25/065* | (2023.01) |
| *H01L 21/48* | (2006.01) |
| *H01L 23/31* | (2006.01) |
| *H01L 23/485* | (2006.01) |
| *H01L 23/00* | (2006.01) |

(Continued)

(52) U.S. Cl.
CPC ...... *H01L 25/0657* (2013.01); *H01L 21/4853* (2013.01); *H01L 21/568* (2013.01); *H01L 23/3107* (2013.01); *H01L 23/485* (2013.01); *H01L 24/05* (2013.01); *H01L 25/50* (2013.01); *H01L 2224/05624* (2013.01);
(Continued)

(58) Field of Classification Search
CPC . H01L 25/0657; H01L 25/50; H01L 21/4853; H01L 21/568; H01L 23/3107; H01L 23/485; H01L 24/05; H01L 2224/05624; H01L 2225/0652; H01L 2225/06548; H01L 2225/06562; H10B 80/00
See application file for complete search history.

(56) References Cited

U.S. PATENT DOCUMENTS

| | | | |
|---|---|---|---|
| 2012/0312776 A1* | 12/2012 | Cheng | ..................... G06F 3/044 |
| | | | 156/247 |
| 2018/0061741 A1* | 3/2018 | Beyne | ................... H01L 23/538 |

(Continued)

*Primary Examiner* — Timor Karimy
(74) *Attorney, Agent, or Firm* — Alston & Bird LLP

(57) ABSTRACT

The present disclosure provides a three-dimensional chip packaging structure and a method of making thereof. The structure includes: a plurality of chips stacked to form a staggered structure, each chip has one end hanging out from a lower chip and another end exposed out and connecting to a pad disposed on the chip, metal connecting pillars formed on the pads, a packaging layer disposed on the metal connecting pillars and the chips, a rewiring layer formed on the packaging layer, and a metal bump formed on the rewiring layer. The structure and method making it do not involve the Through-Silicon-Via (TSV) process, which is commonly used to achieve three-dimensional stacking of chips but is costly at the same time. Instead, the structure and method adopt pads and metal connecting pillars for electric connection. Also, the packaging structure does not necessitate a substrate for support, which reduces the package size.

7 Claims, 3 Drawing Sheets

(51) Int. Cl.
*H01L 25/00* (2006.01)
*H01L 21/56* (2006.01)
(52) U.S. Cl.
CPC ............... *H01L 2225/0652* (2013.01); *H01L 2225/06548* (2013.01); *H01L 2225/06562* (2013.01)

(56) References Cited

U.S. PATENT DOCUMENTS

2018/0211936 A1* 7/2018 Chang .................. H01L 24/20
2021/0118835 A1* 4/2021 Wu ..................... H01L 23/5384

* cited by examiner

THREE-DIMENSIONAL CHIP PACKAGING STRUCTURE AND METHOD THEREOF

CROSS REFERENCE TO RELATED APPLICATION

The present application claims the benefit of priority to Chinese Patent Application No. CN2019112293129, entitled "Three-Dimensional Chip Packaging Structure and Method Thereof", filed with CNIPA on Dec. 4, 2019, and Chinese Patent Application No. CN2019221474307, entitled "Three-Dimensional Chip Packaging Structure and Method Thereof", filed with CNIPA on Dec. 4, 2019, the disclosure of which is incorporated herein by reference in its entirety.

FIELD OF TECHNOLOGY

The present disclosure generally relates to semiconductor packaging technologies, in particular, to a three-dimensional chip packaging structure and method thereof.

BACKGROUND

With rapid development of integrated circuit manufacturing industry, front end processes of integrated circuit technologies are approaching the end of Moore's Law, with lithography reaching the physical limit of exposure, driving up the investment cost. However, back-end processes like packaging might open up more possibilities for the industry.

Existing semiconductor packaging technologies include ball grid array packaging (BGA), chip scale packaging (CSP), wafer level packaging (WLP), three-dimensional packaging (3D), and system-in-package packaging (SiP). Among them, wafer-level packaging (WLP) has been gradually adopted by most semiconductor manufacturers due to its outstanding advantages. All or most of its process steps are completed on silicon wafers. Wafer-level packaging (WLP) has some unique advantages. For example, its packaging efficiency is high because multiple wafers can be processed at the same time. Its processes are also relatively simple. Three-dimensional packaging, however, is another story. It usually adopts the Through-Silicon-Via process (TSV) to achieve three-dimensional stacking of chips, but the TSV process is complex, difficult, and expensive, which increases the cost of three-dimensional packaging of chips.

SUMMARY

The present disclosure provides a three-dimensional chip packaging structure, which includes: more than one chips stacked in a staggered structure, each of the plurality of chips has one end hanging out from a lower chip and another end exposed out and connecting to a pad disposed on a corresponding chip's surface; wherein the plurality of chips is connected with each other; metal connecting pillars, wherein each of the metal connecting pillars is formed on and electrically connected to a corresponding one of the pads; a packaging layer encapsulating the metal connecting pillars and the plurality of chips, wherein the metal connecting pillars are exposed on a top surface of the packaging layer; a rewiring layer formed on the packaging layer and electrically connected to the metal connecting pillars; and a metal bump formed on the rewiring layer.

The present disclosure also provides a method of packaging a three-dimensional chip. The method includes: forming a separation layer on a supporting substrate, wherein the separation layer includes a first surface in contact with the supporting substrate and a second surface opposite to the first surface; stacking a plurality of chips into a staggered structure on the second surface, wherein each of the plurality of chips has one end hanging out from a lower chip and another end exposed out and connecting to a pad disposed on the corresponding chip's surface; wherein the plurality of chips is connected with each other; fabricating metal connecting pillars electrically connected to the pads; encapsulating the metal connecting pillars and the plurality of chips by a packaging layer, wherein the metal connecting pillars are exposed on a top surface of the packaging layer; forming a rewiring layer on the packaging layer, wherein the rewiring layer is electrically connected to the metal connecting pillars; forming a metal bump on the rewiring layer; and removing the separation layer and the supporting substrate.

BRIEF DESCRIPTION OF THE DRAWINGS

FIG. 9 is also a cross-sectional view of the final three-dimensional chip packaging structure according to the embodiment.

DETAILED DESCRIPTION

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Throughout the disclosure, when a first layer of material (or "first layer") is formed "above" or "on" a second layer of material (or "second layer"), the first layer may either be directly on the top of the second layer, or there might be additional material in between the first and the second layers. In other words, after the second layer of material is fabricated, additional material may be deposited on the top of the second layer before the first layer of material being formed. Further, the term "top", "bottom", "above", "below", "up", or "down" may be relative to one surface of a horizontally-placed layer.

Figure 9:
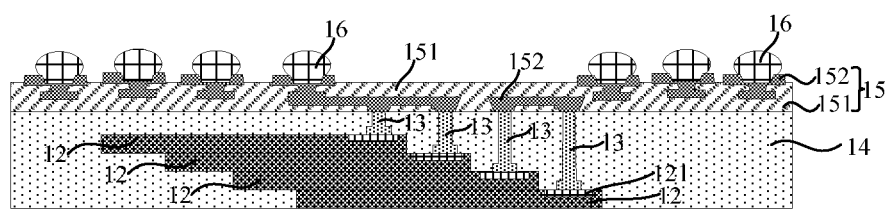

As shown in FIG. 9, the present disclosure provides a three-dimensional chip packaging structure which includes: a plurality of chips 12, metal connecting pillars 13, a packaging layer 14, a rewiring layer 15, and a metal bump 16.

The plurality of chips 12 is stacked in a staggered structure and includes pads 121. Each chip is staggered with one end hanging out on the lower chip and another end exposed out. Each of the plurality of chips 12 includes one of the pads 121. Each of the pads 121 is located on the exposed end of the associated chip. Each of the metal connecting pillars 13 is formed on and electrically connected to one of the pads 121. The packaging layer 14 covers the metal connecting pillars 13 and the staggered chips 12. The top surfaces of the metal connecting pillars 13 are exposed from the top surface of the packaging layer 14. The rewiring layer 15 is formed on the packaging layer 14, and electrically connected to the metal connecting pillars 13. The metal bump 16 is formed on the rewiring layer 15.

The plurality of chips 12 is the kind of chips suitable for three-dimensional packaging. In some embodiments, the plurality of chips 12 are independently functional chips, such as memory chips, circuit chips, etc. In some embodiments, the plurality of chips 12 are integrated functional chips, such as Accelerated Processing Unit (APU) chips, Graphic Processing Unit (GPU) chips, etc.

In some embodiments, the pads 121 are made of aluminum. In some embodiments, an adhesive layer is formed under each of the pads 121, and an anti-reflection layer is formed on each of the pads 121. In some embodiments, the adhesive layer and the anti-reflection layer improve the electrical properties of the pads and offer better adhesion between the pads 121 and the rest of the chips 121.

In some embodiments, the metal connecting pillars 13 are made of materials including one or more of gold, silver, aluminum, and copper.

In some embodiments, the packaging layer 14 is made of materials including one of polyimide, silica gel, and epoxy. In some embodiments, a top surface of the packaging layer 14 is planarized.

In some embodiments, the rewiring layer 15 includes a dielectric layer 151 and a metal wiring layer 152. In some embodiments, the dielectric layer 151 is made of materials including one or more of epoxy, silica gel, polyimide (PI), lead oxide (PBO), Benzocyclobutene (BCB), silicon oxide, phosphosilicate glass, and fluorine-containing glass. In some embodiments, the metal wiring layer 152 is made of materials including one or more of copper, aluminum, nickel, gold, silver, and titanium.

In some embodiments, the metal bump 16 includes one of a gold-tin solder ball, a silver-tin solder ball, and a copper-tin solder ball. In some embodiments, the metal bump 16 includes a metal pillar, and a solder ball formed on the metal pillar. In some embodiments, the metal pillar is made of one of copper and nickel. In some embodiments, the metal bump 16 is a gold-tin solder ball, and it is formed by first forming a gold-tin layer on a surface of the rewiring layer 15, then using a high-temperature reflow process to reflow the gold-tin layer into a ball-shaped structure, and finally forming a gold-tin solder ball after cooling; alternatively the gold-tin solder ball is formed by ball planting process.

As shown in FIGS. 1-9, the present disclosure provides a method for three-dimensional chip packaging. The three-dimensional chip packaging structure disclosed above can be obtained through methods including but not limited to the method provided herein. More specifically, FIGS. 2-9 show cross-sectional views of the intermediate structures after various steps in applying the three-dimensional chip packaging method.

Figure 1:
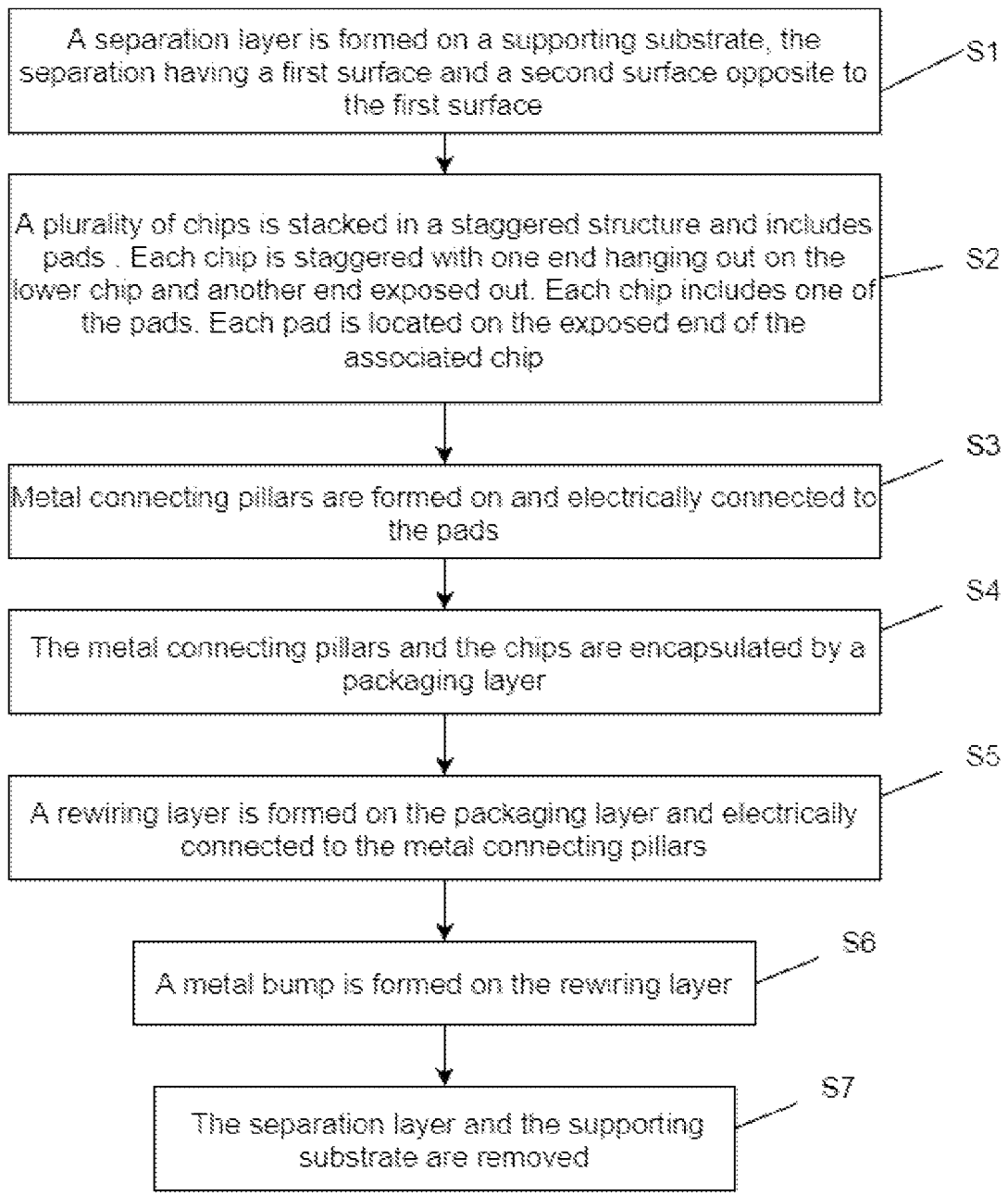
FIG. 1 is a flowchart illustrating a three-dimensional chip packaging method according to one embodiment.
Figure 2:
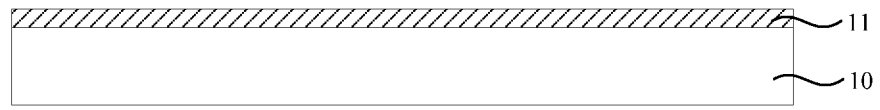
FIGS. 2-9 show cross-sectional views of the intermediate structures after various steps in applying the three-dimensional chip packaging method according to one embodiment.

Referring to FIG. 1 and FIG. 2, at operation S1, a supporting substrate 10 is provided and a separation layer 11 is formed on the supporting substrate 10. The separation layer 11 includes a first surface in contact with the supporting substrate 10 and a second surface opposite to the first surface.

In some embodiments, the supporting substrate 10 includes one of a glass substrate, a metal substrate, a semiconductor substrate, a polymer substrate, and a ceramic substrate. In some embodiments, the supporting substrate 10 is a glass substrate, which is relatively inexpensive and facilitates forming the separation layer 11 on it.

In some embodiments, the separation layer 11 includes a polymer layer. In some embodiments, the separation layer 11 includes an adhesive layer. The polymer layer or adhesive layer is formed by first spin-coating a layer on a surface of the support substrate 10, and solidifying the layer with an ultraviolet light curing process or a thermal curing process.

In some embodiments, the polymer layer includes a light-to-heat conversion layer. In some embodiments, a laser is used to heat the light-to-heat conversion layer to separate the chips 12 and supporting substrate 10 at the light-to-heat conversion layer, in order to remove the supporting substrate 10.

Figure 3:
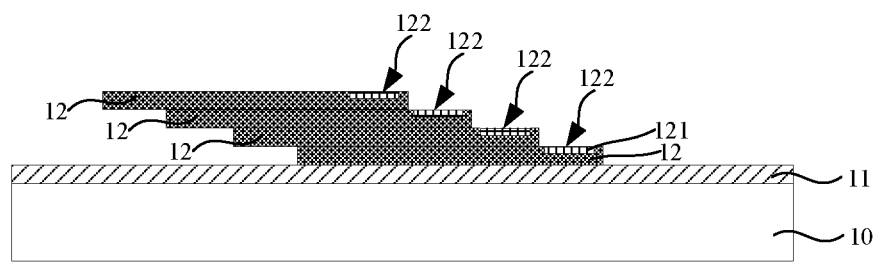

Referring to FIG. 1 and FIG. 3, at operation S2, a plurality of chips is provided. Each of the plurality of chips 12 includes one of the pads 121. The plurality of chips 12 is stacked in a staggered structure and includes pads 121. Each chip is staggered with one end hanging out from the lower chip and another end exposed out and supports the pad on its surface. The bottom chip is disposed on and connects to the second surface of the separation layer 11. Each two neighboring chips of the plurality of chips are connected.

The plurality of chips 12 is the kind of chips suitable for three-dimensional packaging. In some embodiments, the plurality of chips 12 is independently functional chips, such as memory chips, circuit chips, etc. In some embodiments, the plurality of chips 12 is integrated functional chips, such as APU chips, GPU chips, etc.

In some embodiments, the pads 121 are made of aluminum. In some embodiments, an adhesive layer is formed under each of the pads 121, and an anti-reflection layer is formed on each of the pads 121. In some embodiments, the adhesive layer and the anti-reflection layer improve the electrical properties of the pads and offer better adhesion between the pads 121 and the rest of the chips 12.

In some embodiments, the plurality of chips 12 has different dimensions. In some embodiments, the plurality of chips 12 has the same dimension. In some embodiments, the plurality of chips 12 contains variety IC circuits playing different functions. In some embodiments, the plurality of chips 12 plays the same function.

Figure 4:
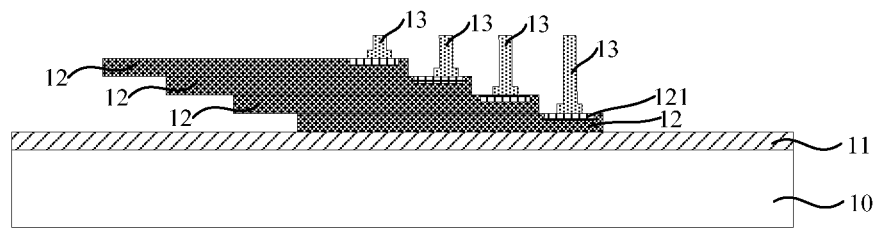

Referring to FIG. 1 and FIG. 4, at operation S3, at least one metal connecting pillar 13 is formed on each of the pads 121 and is electrically connected to the pads 121.

In some embodiments, the metal connecting pillars 13 are fabricated by a wire bonding process. The wire bonding process includes one of a hot-pressed wire bonding process, an ultrasonic bonding wire process, and a hot-pressed ultrasonic bonding wire process. The metal connecting pillars 13 are made of materials including one or more of gold, silver, aluminum, and copper.

In some embodiments, the metal connecting pillars 13 are made by electroplating or electroless plating. The metal connecting pillars 13 are made of materials including at least one of gold, silver, aluminum, and copper.

Figure 5:
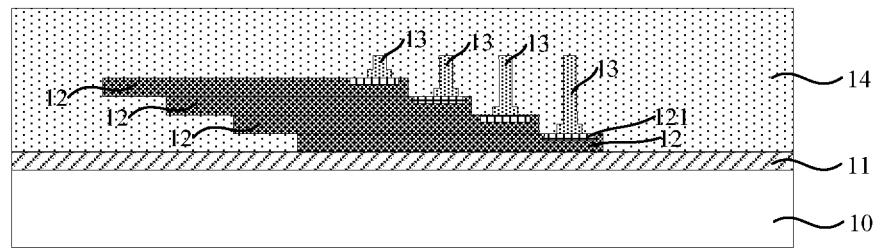
Figure 6:
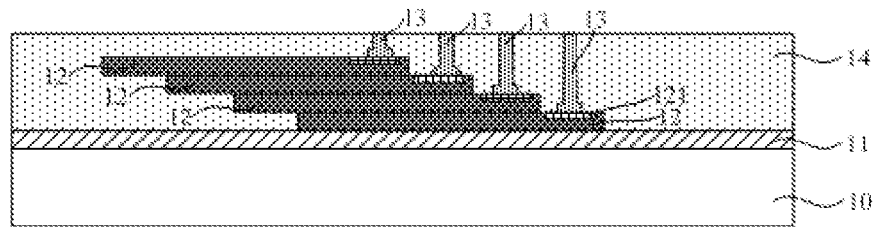

Referring to FIG. 1, FIG. 5 and FIG. 6, at operation S4, the metal connecting pillars 13 and the plurality of chips 12 are encapsulated by a packaging layer 14, and the metal connecting pillars 13 are exposed on a surface of the packaging layer 14.

In some embodiments, the encapsulating of the metal connecting pillars 13 and the plurality of chips 12 is achieved by one of compression molding, transfer molding, liquid seal molding, vacuum lamination, and spin coating.

The packaging layer 14 is made of materials including one of polyimide, silica gel, and epoxy.

In some embodiments, after forming the packaging layer 14, a top surface of the packaging layer 14 is planarized.

Figure 7:
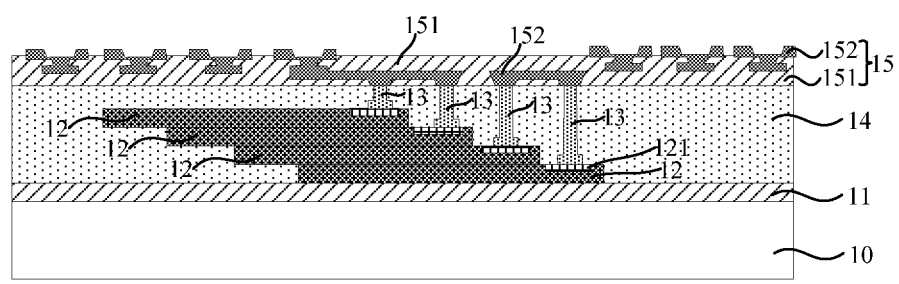

Referring to FIG. 1 and FIG. 7, at operation S5, a rewiring layer 15 is formed on the packaging layer 14 and electrically connected to the metal connecting pillars 13.

In some embodiments, the rewiring layer 15 includes a dielectric layer 151 and a metal wiring layer 152; the material of the dielectric layer 151 includes one or more of epoxy resin, silica gel, PI, PBO, BCB, silicon oxide, phosphosilicate glass, and fluorine-containing glass; the material of the metal wiring layer 152 includes one or more of copper, aluminum, nickel, gold, silver, and titanium.

In some embodiments, the rewiring layer 15 is formed by the following processes:

First, a chemical vapor deposition process or a physical vapor deposition process is used to form the dielectric layer 151 on a surface of the packaging layer 14, and the dielectric layer 151 is etched in patterning process.

Second, a vapor deposition process, a sputtering process, an electroplating process, or an electroless plating process is used to form the metal wiring layer 152 on the surface of the dielectric layer 151, and the metal wiring layer 152 is etched during a patterning process.

Third, the metal connecting pillars 13 are then aligned to and electrically connected to the metal wiring layer 152.

Figure 8:
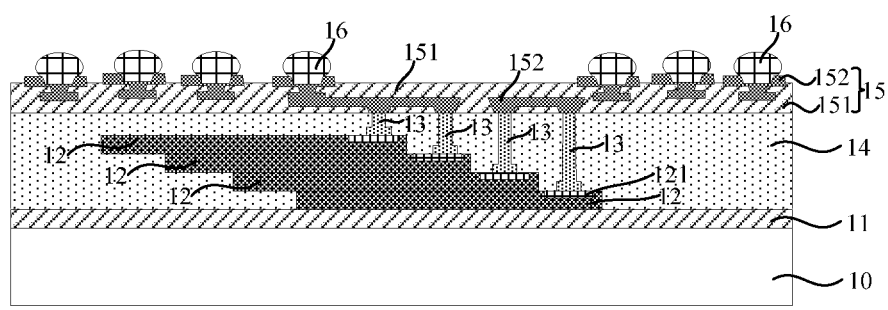

Referring to FIG. 1 and FIG. 8, at operation S6, a metal bump 16 is formed on the rewiring layer 15.

In some embodiments, the metal bump 16 includes one of a gold-tin solder ball, a silver-tin solder ball, and a copper-tin solder ball. In some embodiments, each metal bump 16 includes a metal pillar, and a solder ball formed on the metal pillar. In some embodiments, the metal pillar is made of one of copper and nickel. In some embodiments, the metal bump 16 is a gold-tin solder ball, and it is formed by first forming a gold-tin layer on a surface of the rewiring layer 15, then using a high-temperature reflow process to reflow the gold-tin layer into a ball-shaped structure, and finally forming a gold-tin solder ball after cooling. Alternatively the gold-tin solder ball is formed by ball planting process.

Referring to FIG. 1 and FIG. 9, at operation S7, the separation layer 11 and the supporting substrate 10 are removed from the chips 12 and packaging layer 14.

In some embodiments, when the separation layer 11 includes an adhesive layer, the viscosity of the adhesive layer is reduced by exposure to light when separating the separation layer 11 from the plurality of chips 12.

In some embodiments, when the separation layer 11 includes a light-to-heat conversion layer, the light-to-heat conversion layer is heated and softened by a laser in order to separate the plurality of chips 12 and the supporting substrate 10.

The present disclosure provides a staggered three-dimensional chip packaging structure and method of making thereof. The structure and method adopt pads and metal connecting pillars for electric connection, and they do not involve the Through-Silicon-Via (TSV) process, which is commonly used to achieve three-dimensional stacking of chips, however, it is costly at the same time. Also, the packaging structure provided herein does not necessitate a substrate for support, which reduces the package size.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

LIST OF REFERENCE NUMERALS 10 supporting substrate
11 separation layer
12 chips
121 pad
122 step
13 metal connecting pillars
14 packaging layer
15 rewiring layer
151 dielectric layer
152 metal wiring layer
16 metal bump
S1~S7 Operation steps for a three-dimensional chip packaging method

We claim:

1. A method of packaging a three-dimensional chip, comprising:
    forming a separation layer on a supporting substrate, wherein the separation layer includes a first surface in contact with the supporting substrate and a second surface opposite to the first surface;
    stacking a plurality of chips into a staggered structure on the second surface, wherein each of the plurality of chips has one end hanging out from a lower chip and another end exposed out and connecting to a pad disposed on said another end, and wherein a bottom chip of the plurality of chips is disposed on and connects to the second surface of the separation layer;
    fabricating metal connecting pillars, wherein a bottom end of each of the metal connecting pillars is formed on and electrically connected to the pad of each of the plurality of chips, wherein each one of the metal connecting pillars has an one-to-one correspondence with each one of the plurality of chips;
    encapsulating the metal connecting pillars and the plurality of chips by a packaging layer;
    planarizing the packaging layer to expose a top end of each of the metal connecting pillars from a post-planarizing top surface of the packaging layer;
    forming a rewiring layer on the post-planarizing top surface of the packaging layer, wherein the rewiring layer comprises a dielectric layer and a metal wiring layer, wherein the metal wiring layer is patterned, wherein the patterning is configured to form parts, wherein each part of the metal wiring layer electrically connects top ends of two adjacent metal connecting pillars so as to connect two chips of the plurality of chips having one-to-one correspondence with the two adjacent metal connecting pillars;
    forming a metal bump on the rewiring layer; and
    removing the separation layer and the supporting substrate.

2. The method of packaging the three-dimensional chip according to claim 1,
    wherein the supporting substrate includes one of a glass substrate, a metal substrate, a semiconductor substrate, a polymer substrate, and a ceramic substrate,
    wherein the separation layer includes one of a polymer layer and an adhesive layer,
    wherein the polymer layer or the adhesive layer is fabricated by first spin-coating materials on a surface of the supporting substrate, and then solidifying the materials using ultraviolet light curing or thermal curing process.

3. The three-dimensional chip packaging method according to claim 1, wherein the plurality of chips are stacked and bonded to the second surface using surface-mount technology.

4. The method of packaging the three-dimensional chip according to claim 1,
wherein the dielectric layer comprises one or more first materials selected from one of epoxy, silica gel, PI, PBO, BCB, silicon oxide, phosphosilicate glass, and fluorine-containing glass; and
wherein the metal wiring layer comprises one or more second materials selected from one of cooper aluminum, nickel, gold, silver, and titanium.

5. The method of packaging the three-dimensional chip according to claim 4, wherein a method for forming the rewiring layer includes:
forming the dielectric layer on a top surface of the packaging layer by using a chemical vapor deposition process or a physical vapor deposition process;
etching the dielectric layer to form a patterned dielectric layer;
forming the metal wiring layer on a surface of the patterned dielectric layer by using a chemical vapor deposition process, a physical vapor deposition process, a sputtering process, an electroplating process, or an electroless plating process;
etching the metal wiring layer to form the patterned metal wiring layer; and
electrically connecting said two adjacent chips of the plurality of chips by connecting their corresponding metal connecting pillars to the patterned metal wiring layer.

6. The method of packaging the three-dimensional chip according to claim 4, wherein the metal connecting pillars are made by electroplating or electroless plating.

7. The method of packaging the three-dimensional chip according to claim 4, wherein the metal connecting pillars are made of materials including at least one of gold, silver, aluminum, and copper.

\* \* \* \* \*